(12) United States Patent
Seo

(10) Patent No.: US 10,955,123 B2
(45) Date of Patent: Mar. 23, 2021

(54) MICRO-LED MODULE AND METHOD FOR FABRICATING THE SAME

(71) Applicant: LUMENS CO., LTD., Yongin-si (KR)

(72) Inventor: Juok Seo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 85 days.

(21) Appl. No.: 16/364,594

(22) Filed: Mar. 26, 2019

(65) Prior Publication Data

US 2019/0360673 A1     Nov. 28, 2019

(30) Foreign Application Priority Data

May 28, 2018   (KR) ......................... 10-2018-0060571

(51) Int. Cl.
| | |
|---|---|
| *H01L 23/492* | (2006.01) |
| *F21V 23/00* | (2015.01) |
| *H01L 33/48* | (2010.01) |
| *H01L 33/18* | (2010.01) |

(52) U.S. Cl.
CPC .......... *F21V 23/002* (2013.01); *F21V 23/004* (2013.01); *H01L 23/492* (2013.01); *H01L 33/18* (2013.01); *H01L 33/483* (2013.01)

(58) Field of Classification Search
None
See application file for complete search history.

(56) References Cited

U.S. PATENT DOCUMENTS

| | | | | |
|---|---|---|---|---|
| 6,446,948 | B1 * | 9/2002 | Allen | .................... B25B 11/005 118/500 |
| 8,399,269 | B2 * | 3/2013 | Wang | ..................... H01L 33/62 438/22 |
| 8,669,607 | B1 * | 3/2014 | Tsair | .................. H01L 29/7881 257/316 |
| 2004/0057286 | A1 * | 3/2004 | Chen | ................ H01L 27/11524 365/185.17 |
| 2013/0020626 | A1 * | 1/2013 | Tan | .................. H01L 29/42344 257/316 |
| 2017/0345841 | A1 * | 11/2017 | Wu | ................... H01L 29/66545 |

\* cited by examiner

*Primary Examiner* — Ali Naraghi
(74) *Attorney, Agent, or Firm* — Mei & Mark LLP

(57) ABSTRACT

Disclosed is a method for fabricating a micro-LED module. The method includes: preparing a circuit board; forming solder bumps on one surface of the circuit board; arranging micro-LED chips on the one surface of the circuit board such that the micro-LED chips are in contact with the solder bumps; heating the solder bumps to bond the micro-LED chips to the one surface of the circuit board through the solder bumps; arranging driver ICs on the other surface of the circuit board such that the driver ICs are in contact with solders on the other surface of the circuit board in a state in which the micro-LED chips are bonded to the circuit board; and heating the solders to bond the driver ICs to the other surface of the circuit board through the solders. The micro-LED chips are arranged on the one surface of the circuit board after the flatness of the circuit board is enhanced.

17 Claims, 6 Drawing Sheets

MICRO-LED MODULE AND METHOD FOR FABRICATING THE SAME

BACKGROUND OF THE INVENTION

1. Field of the Invention

The present invention relates to a micro-LED module, and more specifically to a method for fabricating a micro-LED module while preventing micro-LED chips from being mounted in incorrect positions on a circuit board attached with driver ICs by poor flatness of the circuit board, and a micro-LED module fabricated by the method.

2. Description of the Related Art

A micro-LED display (MLD) typically includes one or more micro-LED modules including a plurality of micro-LED chips. In a broad sense, the term "micro-LED chip" is defined as an LED chip having at least one side whose length is several hundreds of micrometers or less. In a narrow sense, the term "micro-LED chip" is defined as an LED chip having at least one side whose length is a hundred micrometers or less. Particularly, LED chips having at least one side whose length exceeds a hundred micrometers are also called "mini-LED chips". Herein, LED chips whose sides are several hundreds of micrometers or less in length are collectively referred to as "micro-LED chips".

On the other hand, a micro-LED module include a circuit board attached with a plurality of driver ICs on one surface thereof and mounted with a plurality of micro-LED chips on the other surface thereof. The driver ICs serve to drive the micro-LED chips.

FIG. 1 schematically illustrates a conventional method for fabricating a micro-LED module. Referring to FIG. 1, a circuit board 2 is first prepared and driver ICs 4 are then attached to one surface of the circuit board 2 by surface mount technology (SMT). Thereafter, micro-LED chips 6 are attached to the other surface of the circuit board by SMT to complete the fabrication of a micro-LED module.

According to the conventional method, the circuit board has poor flatness, making it difficult to precisely mount the micro-LED chips in their correct positions on the circuit board. Particularly, when the micro-LED chips are simultaneously attached to the surface of the circuit board by a multi-chip transfer process, poor flatness of the circuit board leads to severe defects, for example, a large difference in pitch between the micro-LED chips. The circuit board is susceptible to natural deformation such as warpage, losing its flatness. When the driver ICs are attached to the bottom surface of the circuit board through solders, the circuit board is curved convexly or concavely, resulting in a marked decrease in flatness. The micro-LED chips are difficult to attach to correct positions on the circuit board with poor flatness when mounted (particularly by a multi-chip transfer process).

In the case where large-sized LED chips are mounted on a circuit board, the LED chips can be mounted in correct positions on the circuit board to some extent through precise process control despite poor flatness of the circuit board. However, when small-sized micro-LED chips are picked up from their original locations, placed in desired positions on a circuit board, and bonded to the circuit board, their small size makes it difficult to precisely control the pick-up and placing. Due to this difficulty, the LED chips may not be seated in their correct positions or may be tilted, causing the formation of defects in a final display and deteriorating the reliability of the display.

SUMMARY OF THE INVENTION

It is an object of the present invention to provide a method for fabricating a micro-LED module while preventing micro-LED chips from being mounted in incorrect positions on a circuit board attached with driver ICs by poor flatness of the circuit board.

A method for fabricating a micro-LED module according to one aspect of the present invention includes: preparing a circuit board; forming solder bumps on one surface of the circuit board; arranging micro-LED chips on the one surface of the circuit board such that the micro-LED chips are in contact with the solder bumps; heating the solder bumps to bond the micro-LED chips to the one surface of the circuit board through the solder bumps; arranging driver ICs on the other surface of the circuit board such that the driver ICs are in contact with solders on the other surface of the circuit board in a state in which the micro-LED chips are bonded to the circuit board; and heating the solders to bond the driver ICs to the other surface of the circuit board through the solders, wherein the micro-LED chips are arranged on the one surface of the circuit board after the flatness of the circuit board is enhanced.

According to one embodiment, a vacuum chuck formed with through-holes is brought into contact with the other surface of the circuit board and the circuit board is then adsorbed to the vacuum chuck by vacuum suction through the through-holes, achieving high flatness of the circuit board.

According to one embodiment, each of the through-holes has a smaller size than the corresponding micro-LED chip.

According to one embodiment, the center of each of the through-holes coincides with the center of the corresponding micro-LED chip arranged on the one surface of the circuit board.

According to one embodiment, the melting point of the solders for bonding the driver ICs is not higher than that of the solder bumps for bonding the micro-LED chips.

According to one embodiment, each of the micro-LED chips is of a flip-chip type and the solder bumps are formed in pairs corresponding to the micro-LED chips on one surface of the circuit board.

According to one embodiment, several micro-LED chips are simultaneously pick up and placed on the one surface of the circuit board using a multi-chip loader.

According to one embodiment, the arrangement of the micro-LED chips on the one surface of the circuit board includes arranging first micro-LED chips emitting light of a first wavelength band on the one surface of the circuit board using a multi-chip loader, arranging second micro-LED chips emitting light of a second wavelength band adjacent to the corresponding first micro-LED chips using the multi-chip loader, and arranging third micro-LED chips emitting light of a third wavelength band adjacent to the corresponding second micro-LED chips using the multi-chip loader.

According to one embodiment, the micro-LED chips are pressed against the one surface of the circuit board using a chip pressing unit and the chip pressing unit includes a carrier formed with a plurality of chip pressing stamp holes corresponding to the micro-LED chips and chip pressing pin stamps movable up and down along the stamp holes.

According to one embodiment, the driver ICs are pressed against the other surface of the circuit board using a driver IC pressing unit and the driver IC pressing unit includes a carrier formed with a plurality of driver IC pressing stamp holes corresponding to the driver ICs and driver IC pressing pin stamps movable up and down along the stamp holes.

A micro-LED module according to a further aspect of the present invention includes: a circuit board; solder bumps formed on one surface of the circuit board; a plurality of micro-LED chips bonded to the one surface of the circuit board through the solder bumps; solders formed on the other surface of the circuit board after bonding of the micro-LED chips to the one surface of the circuit board; and driver ICs bonded to the other surface of the circuit board through the solders, wherein the melting point of the solders is not higher than that of the solder bumps. Each of the micro-LED chips is of a flip-chip type and the solder bumps are formed in pairs corresponding to the micro-LED chips.

According to one embodiment, the solders are formed after the plurality of micro-LED chips are bonded to the one surface of the circuit board.

According to one embodiment, the circuit board has high flatness.

According to one embodiment, the plurality of LED chips are combined into pixels, the plurality of pixels are grouped, and the pixel groups are controlled by the corresponding driver ICs.

According to one embodiment, the driver ICs are formed on the other surface of the circuit board to control the corresponding overlying pixel groups.

A micro-LED module according to another aspect of the present invention includes: a circuit board; solder bumps formed on one surface of the circuit board; a plurality of micro-LED chips bonded to the one surface of the circuit board through the solder bumps; solders formed on the other surface of the circuit board; and driver ICs bonded to the other surface of the circuit board through the solders, wherein a vacuum chuck is used to enhance the flatness of the circuit board.

According to one embodiment, the melting point of the solders for bonding the driver ICs is not higher than that of the solder bumps for bonding the micro-LED chips.

According to one embodiment, the vacuum chuck is formed with through-holes.

According to one embodiment, the center of each of the through-holes coincides with the center of the corresponding micro-LED chip.

According to one embodiment, the plurality of LED chips are combined into pixels, the plurality of pixels are grouped, and the pixel groups are controlled by the corresponding driver ICs formed on the other surface of the underlying circuit board.

According to the prior art method, driver ICs are first attached to a circuit board with poor flatness and micro-LED chips are then mounted on the opposite surface of the circuit board. The attachment of the driver ICs further deteriorates the flatness of the circuit board, making it difficult to mount the micro-LED chips in correct positions. In contrast, according to the method of the present invention, micro-LED chips are first mounted on one surface of a circuit board whose flatness has been previously enhanced, and driver ICs are then attached to the opposite surface of the circuit board. The method of the present invention ensures precise and accurate mounting of the micro-LED chips on the circuit board.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention.

Figure 1:
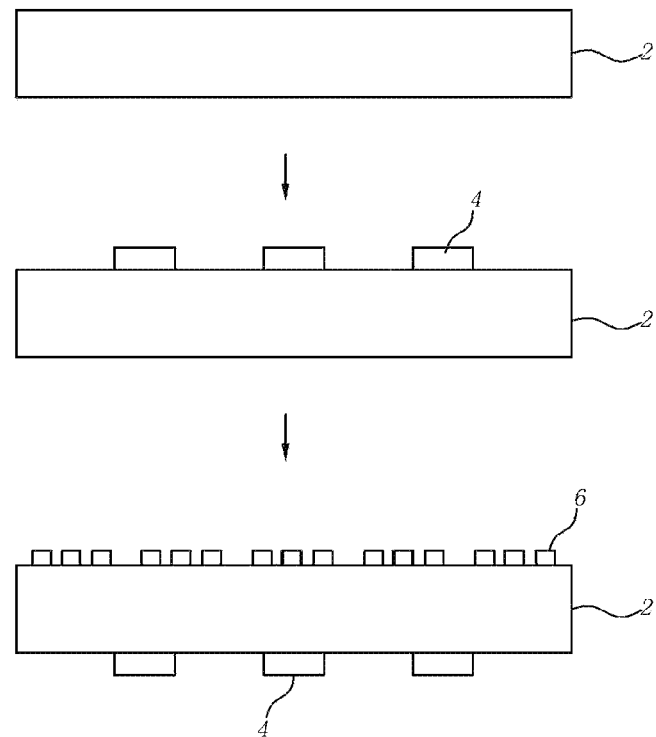
FIG. 1 illustrates a conventional method for fabricating a micro-LED module.
Figure 2:
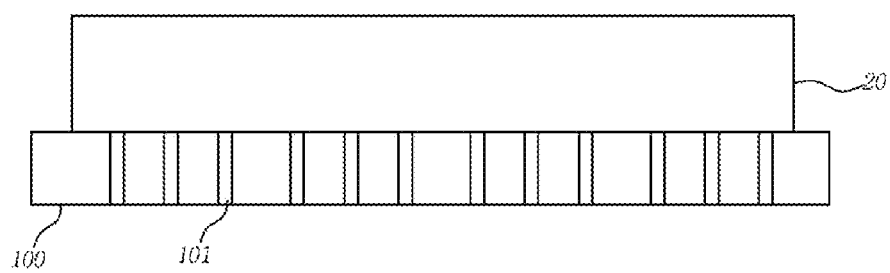
FIG. 2 illustrates the step of planarizing a circuit board in a method according to one embodiment of the present invention.
Figure 3:
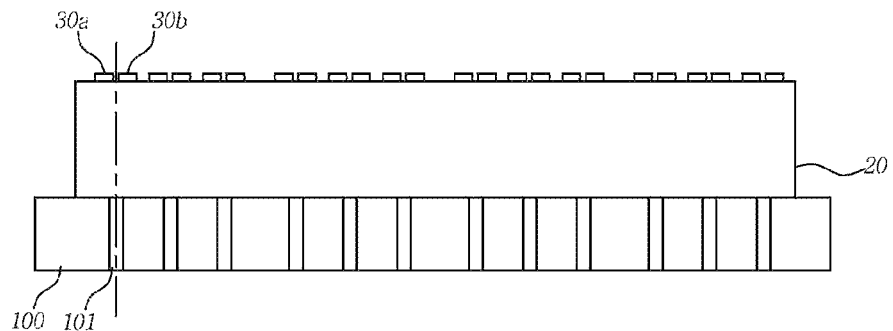
FIG. 3 illustrates the step of forming solder bumps on the upper surface of the circuit board in FIG. 2.
Figure 6:
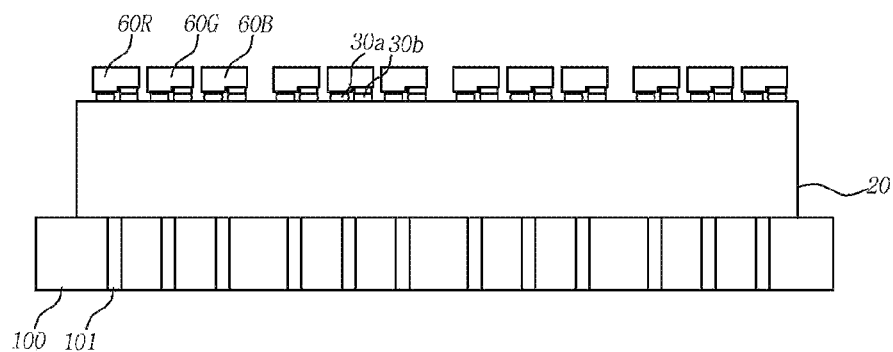
Figure 7:
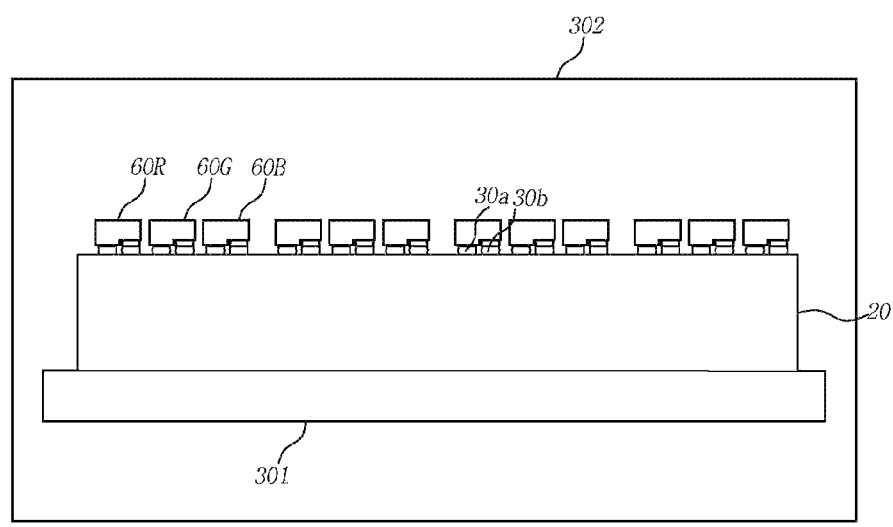
Figure 8:
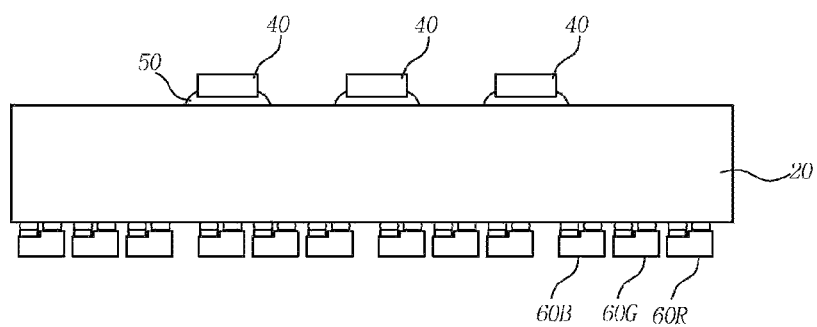
FIGS. 8 and 9 illustrate the step of attaching driver ICs to the lower surface of the circuit board in FIG. 7.
Figure 9:
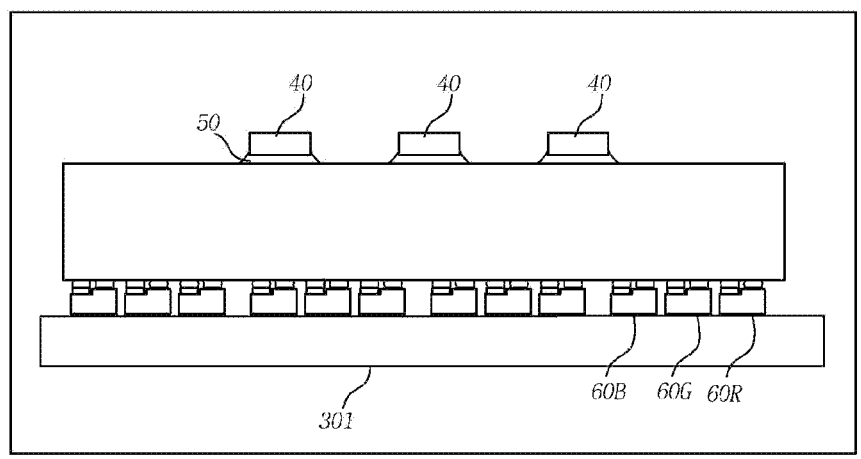

FIG. 2 illustrates the step of planarizing a circuit board in a method according to one embodiment of the present invention, FIG. 3 illustrates the step of forming solder bumps on the upper surface of the circuit board, FIGS. 4 to 7 illustrate the step of mounting micro-LED chips on the circuit board, and FIGS. 8 and 9 illustrate the step of attaching driver ICs to the lower surface of the circuit board.

Referring to FIG. 2, a circuit board 20 including an upper surface and a lower surface is prepared. The circuit board 20 may be a printed circuit board (PCB), a flexible circuit board, such as a flexible printed circuit board (FPCB), or a TFT board. A vacuum chuck 100 is prepared to planarize the circuit board 20 flat, particularly the upper surface of the circuit board 20. The vacuum chuck 100 is prepared by forming through-holes 101 in a planar substrate. The substrate may be, for example, a semiconductor substrate, a ceramic substrate or a metal substrate. The semiconductor substrate may be made of Si, sapphire, GaAs or AlN. The through-holes 101 penetrates from the upper surface of the planar substrate to the lower surface. The through-holes 101 can be formed by dry etching, wet etching, ion milling or physical drilling. The size of the through-holes 101 may vary depending on the size of micro-LED chips to be mounted on the circuit board 20. The through-holes 101 are smaller in size than the micro-LED chips. The through-holes 101 have a size of several to several hundreds of micrometers. The cross-sectional size of the through-holes 101 may be uniform as a whole. Alternatively, the through-holes 101 may be stepped. That is, each of the through-holes 101 has a double cross-sectional structure whose upper and lower cross-sectional areas are different. The vacuum chuck 100 is arranged in contact with the lower surface of the circuit board 20 and adsorbs the circuit board 20 by vacuum suction through the through-holes 101. Here, the upper surface of the vacuum chuck 100 is flat and the lower surface of the circuit board 20 comes into close contact with the flat upper surface of the vacuum chuck 100 by the vacuum suction, resulting in high flatness of the circuit board 20. Since the flatness of areas where micro-LED chips are to be mounted is of particular importance, it is preferable to match the center of each of the through-holes 101 to the center of the corresponding micro-LED chip in the subsequent mounting step. However, the center of each of the through-holes 101 does not need to be accurately matched to the center of the corresponding micro-LED chip. In this case, it is preferable to appropriately align the locations of the through-holes with those of solder bumps to be formed in the subsequent step.

Referring to FIG. 3, in a state in which the lower surface of the circuit board 20 is in close contact with the upper surface of the vacuum chuck 100, the upper surface of the circuit board 20 is planarized by vacuum suction of the vacuum chuck 100. Pairs of solder bumps 30a and 30b are formed on the planarized upper surface of the circuit board 20. Here, the center of each of the through-holes 101 of the vacuum chuck 100 coincides with the midpoint of the corresponding pair of solder bumps 30a and 30b. With this arrangement, the center of each of the through-holes 101 is matched to the center of the corresponding micro-LED chip to be mounted in the subsequent step. The solders for the solder bumps 30a and 30b have a melting point of a first temperature.

In this embodiment, a pair of solder bumps 30a and 30b are used for each of the micro-LED chips that is of a flip-chip type. Alternatively, when each of the micro-LED chips is of a vertical type, one solder bump may be formed corresponding to one micro-LED chip. In this case, the center of each of the through-holes may coincide with the center of the corresponding solder bump.

In this embodiment, the pairs of solder bumps 30a and 30b are formed on the upper surface of the circuit board 20 in a state in which the circuit board 20 is planarized by adsorption to the vacuum chuck 100. Alternatively, it is noted that the circuit board 20 may be planarized by adsorption to the vacuum chuck 100 after the pairs of solder bumps 30a and 30b are previously formed on the upper surface of the circuit board 20.

Figure 4:
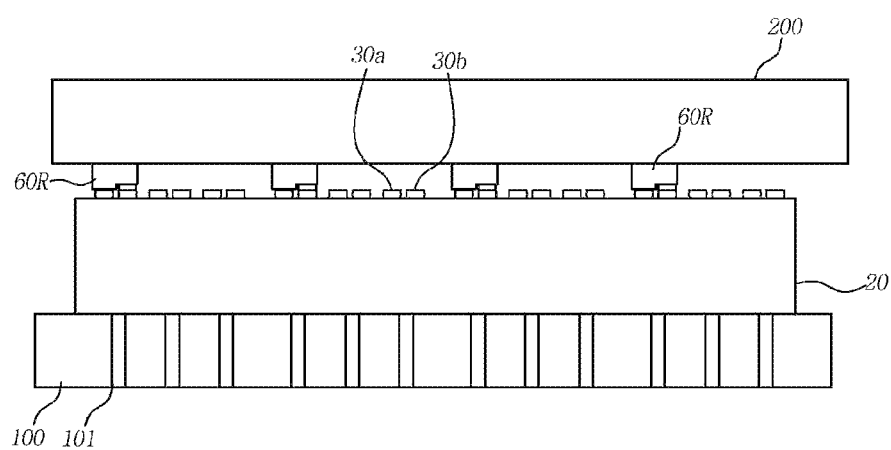
FIGS. 4 to 7 illustrate the step of mounting micro-LED chips on the circuit board in FIG. 3.
Figure 5:
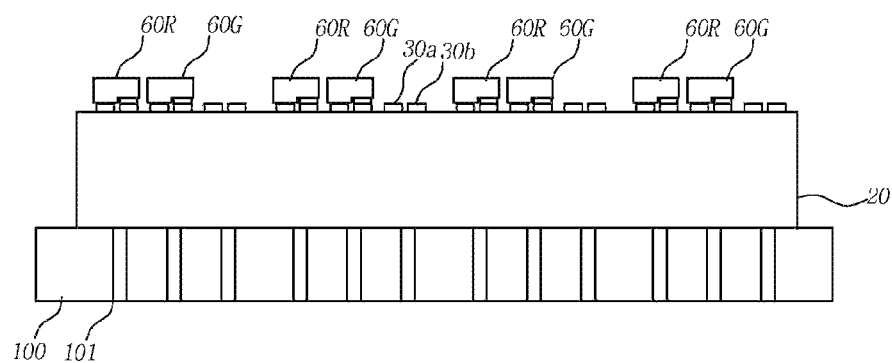

Referring next to FIGS. 4 to 6, micro-LED chips 60R, 60G, and 60B are mounted on the upper surface of the circuit board 20 through the pairs of solder bumps 30a and 30b. The circuit board 20 remains flat by the vacuum chuck 100. Preferably, a multi-chip loader 200 is used to mount the micro-LED chips 60R, 60G, and 60B. The multi-chip loader 200 simultaneously picks up several micro-LED chips from their original locations and places the picked-up micro-LED chips on the circuit board 20. An adhesive is previously applied to the upper surface of the circuit board 20, more specifically to the pairs of solder bumps 30a and 30b.

Referring first to FIG. 4, a plurality of red micro-LED chips 60R emitting light of a red wavelength band are picked up from their original locations and placed using a multi-chip loader 200 such that pairs of electrode pads of the micro-LED chips 60R are in close contact with the corresponding pairs of solder bumps 30a and 30b formed on the circuit board 20. Referring next to FIG. 5, the multi-chip loader 200 (see FIG. 4) is used to pick up a plurality of green micro-LED chips 60G emitting light of a green wavelength band from their original locations and place the picked-up green micro-LED chips 60G such that pairs of electrode pads of the green micro-LED chips 60G are in close contact with the corresponding pairs of solder bumps 30a and 30b formed on the circuit board 20. Referring next to FIG. 6, the multi-chip loader 200 (see FIG. 4) is used to pick up a plurality of blue micro-LED chips 60B emitting light of a blue wavelength band from their original locations and place the picked-up blue micro-LED chips 60B such that pairs of electrode pads of the blue micro-LED chips 60B are in close contact with the corresponding pairs of solder bumps 30a and 30b formed on the circuit board 20.

Referring next to FIG. 7, the circuit board 20 on which the micro-LED chips 60R, 60G, and 60B are preliminarily attached to the pairs of solder bumps 30a and 30b are loaded on a conveyor 301 and passed through a reflow oven 302 to melt the solder bumps 30a and 30b. Thereafter, the molten solder bumps 30a and 30b are hardened, and as a result, the micro-LED chips 60R, 60G, and 60B are mounted on the upper surface of the circuit board 20. The micro-LED chips may be bonded to the surface of the circuit board by heating the circuit board using a heating block instead of the reflow process. In this case, the heating block is arranged under the circuit board to heat the solder bumps formed on the circuit board.

Referring now to FIG. 8, the circuit board 20 mounted with the micro-LED chips 60R, 60G, and 60B is inverted such that its upper surface is directed downward, and then driver ICs 40 are arranged on the lower surface of the circuit board 20 so as to be in contact with solders 50 applied to the lower surface of the circuit board 20.

Referring next to FIG. 9, the circuit board 20, the micro-LED chips 60R, 60G, and 60B bonded on one surface of the circuit board 20, and the driver ICs 40 arranged on the opposite surface of the circuit board 20 are loaded on the conveyor 301 and passed through the reflow oven 302. As a result of this reflow process, the driver ICs 40 are attached to the lower surface of the circuit board 20. The solders 50 for mounting the driver ICs 40 have a melting point of a second temperature.

The melting point of the solders 50 is not higher than the melting point of the solder bumps 30a and 30b, which is preferable to prevent the solder bumps 30a and 30b for bonding the micro-LED chips 60R, 60G, and 60B from being re-melted during the reflow process for bonding the driver ICs 40. That is, the second temperature is not higher than the first temperature. The most preferred melting point of the solders 50 that are heated to bond the driver ICs 40 to the lower surface of the circuit board 20 is lower by about 10-52° C. than the melting point of the solder bumps 30a and 30b. Although the solder bumps 30a and 30b melted and primarily hardened before bonding of the driver ICs 40 have the same melting point as the solders 50, there is a low possibility that the solder bumps 30a and 30b may be re-melted when the solders 50 are melted. However, the melting point of the material for the solders 50 is lower by about 10-52° C. than that of the material for the solder bumps 30a and 30b, which is desirable to more securely prevent re-melting of the solder bumps.

Table 1 compares the melting points, compositions, and powder sizes of different kinds of solders for the solder bumps used to bond the micro-LED chips and solders used to bond the driver ICs in the present invention.

TABLE 1

| Elements where solder is applied | Solder | Composition | Solder powder size (μm) | Melting point (° C.) |
|---|---|---|---|---|
| Micro-LED chips | SAC305 | 96.5% Sn/3.0% Ag/0.5% Cu | T6 | 217-227 |
|  | SAC304 | 95.5% Sn/4.0% Ag/0.5% Cu | T6 | 217-227 |
|  | Low melting point solder | 42% Sn/58% Bi | T5 | 195-205 |
| Driver ICs | ESP | 42% Sn/58% Bi | T6 | 175-185 |
|  | ESP | 42% Sn/57.6% Bi/0.4% Ag | T5 | 175-185 |

As can be seen from Table 1, the solders for the solder bumps used to bond the micro-LED chips have higher melting points than the solders used to bond the driver ICs due to their higher Sn contents. The Bi-containing solders have low melting points. The melting points of the Bi-containing solders may be different depending on the particle sizes of the solder powders despite the same contents of Sn and Bi. That is, the melting point of the solder increases with decreasing particle size of the solder powder.

Table 2 shows the particle sizes of the solder powders according to JEDEC Standard.

TABLE 2

| Powder particle size (μm) | |
|---|---|
| T3 | 25-45 |
| T4 | 20-38 |
| T5 | 15-25 |
| T6 | 10-18 |
| T7 | 10↓ |

Figure 10:
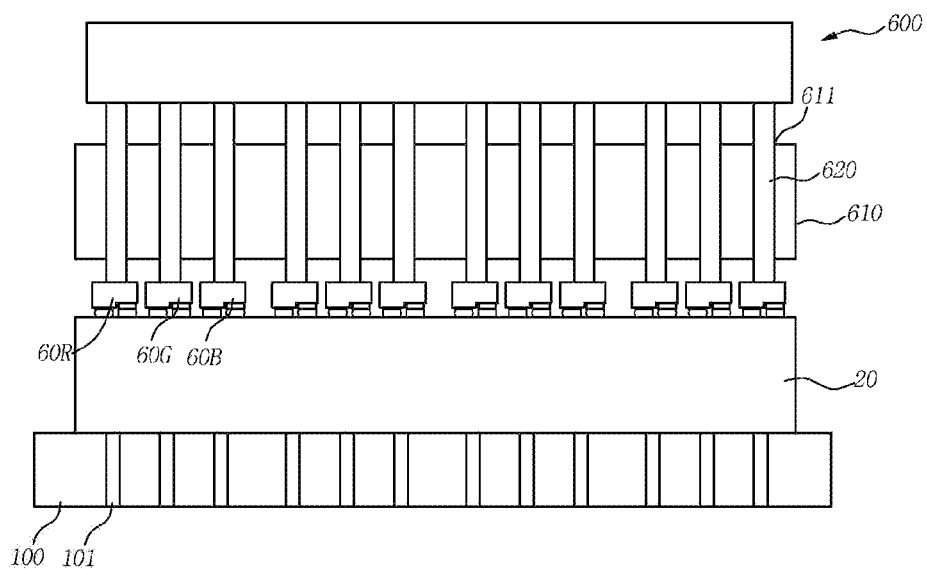
FIGS. 10 and 11 illustrate methods according to further embodiments of the present invention.
Figure 11:
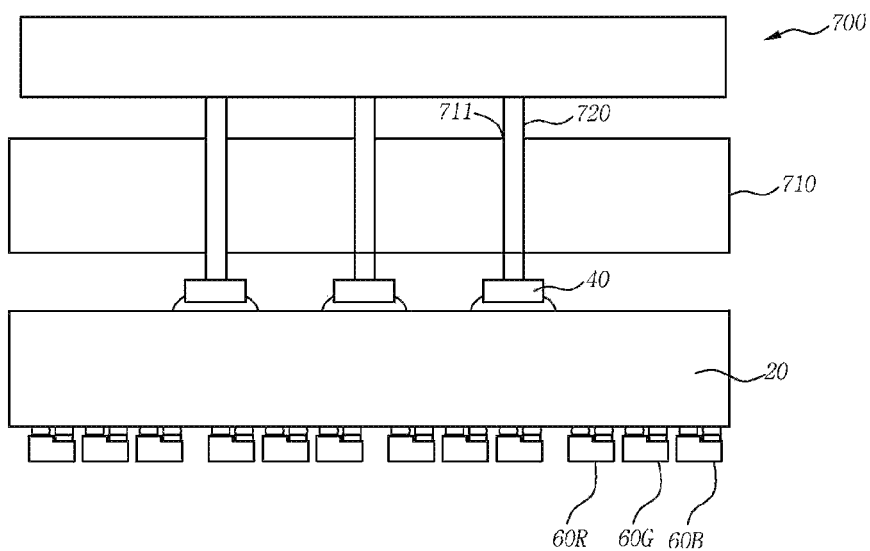

FIGS. 10 and 11 illustrate methods according to further embodiments of the present invention.

Referring to FIG. 10, a chip pressing unit 600 is used to press the micro-LED chips 60R, 60G, and 60B against the circuit board 20. The chip pressing unit 600 includes a carrier 610 formed with a plurality of chip pressing stamp holes 611 corresponding to the micro-LED chips 60R, 60G, and 60B and chip pressing pin stamps 620 movable up and down along the stamp holes 611. After preliminary attachment of the micro-LED chips 60R, 60G, and 60B, the pin stamps 620 descend along the corresponding stamp holes 611 and press the corresponding micro-LED chips 60R, 60G, and 60B against the circuit board 20 to enhance the attachment of the micro-LED chips 60R, 60G, and 60B to the circuit board 20.

Referring to FIG. 11, a driver IC pressing unit 700 is used to press the driver ICs 40 against the circuit board 20. The driver IC pressing unit 700 includes a carrier 710 formed with a plurality of driver IC pressing stamp holes 711 corresponding to the driver ICs 40 and driver IC pressing pin stamps 720 movable up and down along the stamp holes 711. After preliminary attachment of the driver ICs 40, the pin stamps 720 descend along the corresponding stamp holes 711 and press the corresponding driver ICs 40 against the circuit board 20 to enhance the attachment of the driver ICs 40 to the circuit board 20.

Figure 12:
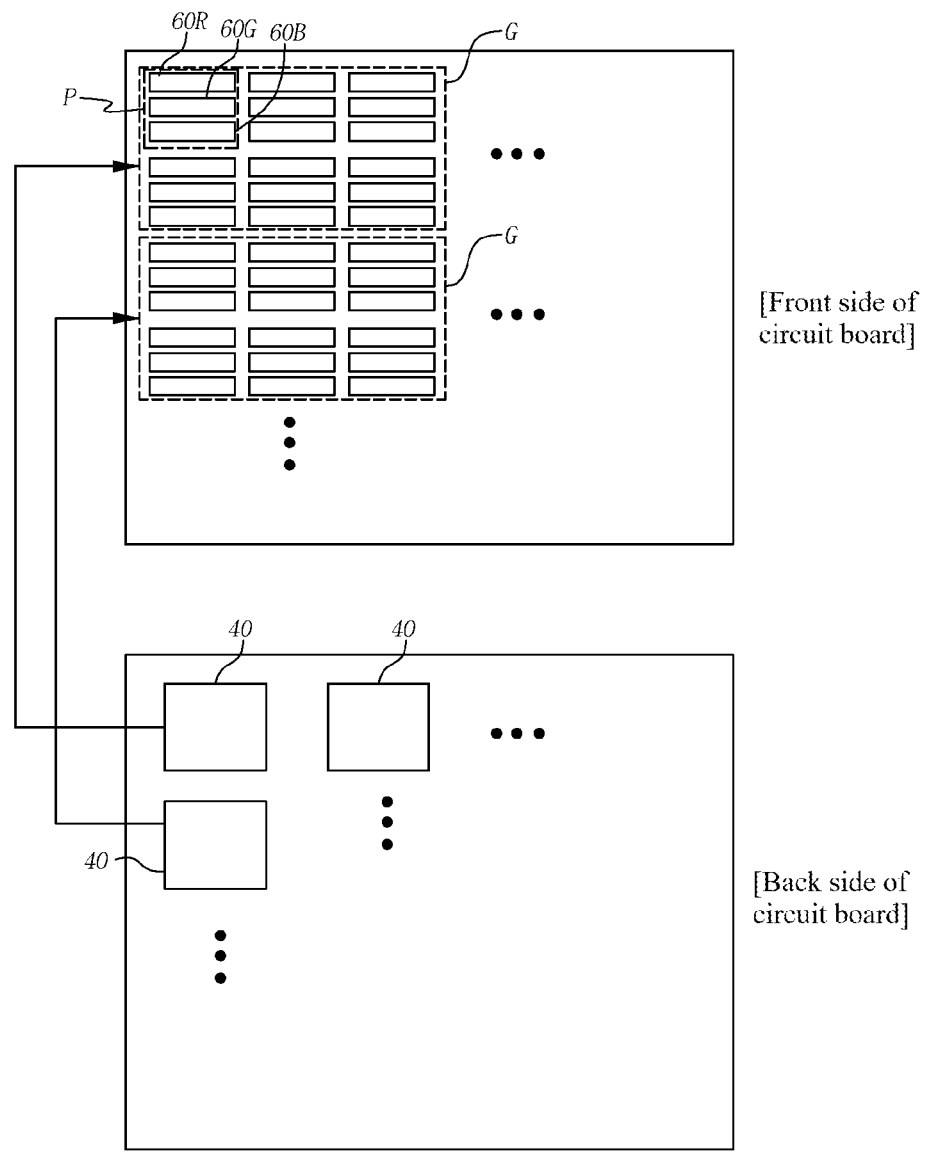
FIG. 12 schematically illustrates an application example of a micro-LED module fabricated by a method of the present invention for a display.

A micro-LED module fabricated by the method according to the foregoing embodiments is applied to a display, as illustrated in FIG. 12.

Referring to FIG. 12, a plurality of LED chips including red micro-LED chips 60R, green micro-LED chips 60G, and blue micro-LED chips 60B are bonded to one surface (front side) of a circuit board and a plurality of driver ICs 40 are bonded to the other surface (rear side) of the circuit board. The red micro-LED chips 60R, the green micro-LED chips 60G, and the blue micro-LED chips 60B are combined into pixels P. The plurality of pixels P are grouped and the pixel groups G are controlled by the corresponding driver ICs 40 formed on the other surface of the underlying circuit board.

What is claimed is:

1. A method for fabricating a micro-LED module, comprising:
    preparing a circuit board;
    forming solder bumps on one surface of the circuit board;
    arranging micro-LED chips on the one surface of the circuit board such that the micro-LED chips are in contact with the solder bumps;
    heating the solder bumps to bond the micro-LED chips to the one surface of the circuit board through the solder bumps;
    arranging driver ICs on the other surface of the circuit board such that the driver ICs are in contact with solders on the other surface of the circuit board in a state in which the micro-LED chips are bonded to the circuit board; and
    heating the solders to bond the driver ICs to the other surface of the circuit board through the solders,
    wherein the micro-LED chips are arranged on the one surface of the circuit board after the flatness of the circuit board is enhanced,
    wherein the micro-LED chips are pressed against the one surface of the circuit board using a chip pressing unit, and
    wherein the chip pressing unit comprises a carrier formed with a plurality of chip pressing stamp holes corresponding to the micro-LED chips and chip pressing pin stamps movable up and down along the stamp holes.

2. The method according to claim 1, wherein a vacuum chuck formed with through-holes is brought into contact with the other surface of the circuit board and the circuit board is then absorbed to the vacuum chuck by vacuum suction through the through-holes, achieving high flatness of the circuit board.

3. The method according to claim 2, wherein each of the through-holes has a smaller size than the corresponding micro-LED chip.

4. The method according to claim 2, wherein the center of each of the through-holes coincides with the center of the corresponding micro-LED chip arranged on the one surface of the circuit board.

5. The method according to claim 1, wherein the melting point of the solders for bonding the driver ICs is not higher than that of the solder bumps for bonding the micro-LED chips.

6. The method according to claim 1, wherein each of the micro-LED chips is of a flip-chip type and the solder bumps are formed in pairs corresponding to the micro-LED chips on one surface of the circuit board.

7. The method according to claim 1, wherein several micro-LED chips are simultaneously pick up and placed on the one surface of the circuit board using a multi-chip loader.

8. The method according to claim 1, wherein the arrangement of the micro-LED chips on the one surface of the circuit board comprises arranging first micro-LED chips emitting light of a first wavelength band on the one surface of the circuit board using a multi-chip loader, arranging second micro-LED chips emitting light of a second wavelength band adjacent to the corresponding first micro-LED chips using the multi-chip loader, and arranging third micro-LED chips emitting light of a third wavelength band adjacent to the corresponding second micro-LED chips using the multi-chip loader.

9. The method according to claim 1, wherein the driver ICs are pressed against the other surface of the circuit board using a driver IC pressing unit and the driver IC pressing unit comprises a carrier formed with a plurality of driver IC pressing stamp holes corresponding to the driver ICs and driver IC pressing pin stamps movable up and down along the stamp holes.

10. A method for fabricating a micro-LED module, comprising:
preparing a circuit board;
forming solder bumps on one surface of the circuit board;
arranging micro-LED chips on the one surface of the circuit board such that the micro-LED chips are in contact with the solder bumps;
heating the solder bumps to bond the micro-LED chips to the one surface of the circuit board through the solder bumps;
arranging driver ICs on the other surface of the circuit board such that the driver ICs are in contact with solders on the other surface of the circuit board in a state in which the micro-LED chips are bonded to the circuit board; and
heating the solders to bond the driver ICs to the other surface of the circuit board through the solders,
wherein the micro-LED chips are arranged on the one surface of the circuit board after the flatness of the circuit board is enhanced,
wherein the driver ICs are pressed against the other surface of the circuit board using a driver IC pressing unit, and
wherein the driver IC pressing unit comprises a carrier formed with a plurality of driver IC pressing stamp holes corresponding to the driver ICs and driver IC pressing pin stamps movable up and down along the stamp holes.

11. The method according to claim 10, wherein a vacuum chuck formed with through-holes is brought into contact with the other surface of the circuit board and the circuit board is then absorbed to the vacuum chuck by vacuum suction through the through-holes, achieving high flatness of the circuit board.

12. The method according to claim 11, wherein each of the through-holes has a smaller size than the corresponding micro-LED chip.

13. The method according to claim 11, wherein the center of each of the through-holes coincides with the center of the corresponding micro-LED chip arranged on the one surface of the circuit board.

14. The method according to claim 10, wherein the melting point of the solders for bonding the driver ICs is not higher than that of the solder bumps for bonding the micro-LED chips.

15. The method according to claim 10, wherein each of the micro-LED chips is of a flip-chip type and the solder bumps are formed in pairs corresponding to the micro-LED chips on one surface of the circuit board.

16. The method according to claim 10, wherein several micro-LED chips are simultaneously pick up and placed on the one surface of the circuit board using a multi-chip loader.

17. The method according to claim 10, wherein the arrangement of the micro-LED chips on the one surface of the circuit board comprises arranging first micro-LED chips emitting light of a first wavelength band on the one surface of the circuit board using a multi-chip loader, arranging second micro-LED chips emitting light of a second wavelength band adjacent to the corresponding first micro-LED chips using the multi-chip loader, and arranging third micro-LED chips emitting light of a third wavelength band adjacent to the corresponding second micro-LED chips using the multi-chip loader.

* * * * *